United States Patent
Letzelter et al.

(10) Patent No.: US 10,769,824 B2
(45) Date of Patent: Sep. 8, 2020

(54) METHOD FOR DEFINING DRAWING PLANES FOR THE DESIGN OF A 3D OBJECT

(71) Applicant: Dassault Systemes, Velizy Villacoublay (FR)

(72) Inventors: Frederic Letzelter, Longjumeau (FR); Amelie Renard, Chaville (FR)

(73) Assignee: DASSAULT SYSTEMES, Velizy Villacoublay (FR)

( * ) Notice: Subject to any disclaimer, the term of this patent is extended or adjusted under 35 U.S.C. 154(b) by 2 days.

(21) Appl. No.: 16/225,180

(22) Filed: Dec. 19, 2018

(65) Prior Publication Data
US 2019/0206098 A1 Jul. 4, 2019

(30) Foreign Application Priority Data
Dec. 28, 2017 (EP) .................................... 17306969

(51) Int. Cl.
*G06T 11/20* (2006.01)
*G06T 17/00* (2006.01)
(Continued)

(52) U.S. Cl.
CPC ............ *G06T 11/203* (2013.01); *G06F 30/00* (2020.01); *G06T 11/001* (2013.01); *G06T 11/20* (2013.01);
(Continued)

(58) Field of Classification Search
None
See application file for complete search history.

(56) References Cited

U.S. PATENT DOCUMENTS

| 5,459,821 A * | 10/1995 | Kuriyama ............... G06T 17/30 345/420 |
| 2004/0247174 A1* | 12/2004 | Lyons ................. G06F 3/04845 382/154 |

(Continued)

FOREIGN PATENT DOCUMENTS

| EP | 2889738 A1 | 7/2015 |
| EP | 3179451 A1 | 6/2017 |

OTHER PUBLICATIONS

European Search Report for European Application No. EP 17306969.1, titled: Method for Defining Drawing Planes for the Design of a 3D Object, dated: Jun. 12, 2018.
(Continued)

*Primary Examiner* — Yi Wang
(74) *Attorney, Agent, or Firm* — Hamilton, Brook, Smith & Reynolds, P.C.

(57) ABSTRACT

Computer method and system draws a 3D object, by sketching at least one first stroke (ST1) in a first plane (PL1) rendered in a first viewing frustum corresponding to a first pose of a virtual camera. The first plane (PL1) is orthogonal to a second (PL2) and a third plane (PL3). In response to a command of a user switching from the first pose to a second pose of the virtual camera, the method and system switches from the first viewing frustum to a second viewing frustum corresponding to the second pose of the virtual camera. The second viewing frustum is bounded by a near plane on the side of the virtual camera. Next a plane is selected as current drawing plane. The selected plane is among the first (PL1), the second (PL2) and the third plane (PL3), whose normal is the closest to the normal of the near plane. At least one second stroke (ST2) is then sketched in the current drawing plane.

12 Claims, 6 Drawing Sheets

(51) Int. Cl.
*G06T 19/20* (2011.01)
*G06T 11/00* (2006.01)
*G06F 30/00* (2020.01)
*G06T 17/10* (2006.01)

(52) U.S. Cl.
CPC .............. *G06T 17/00* (2013.01); *G06T 17/10* (2013.01); *G06T 19/20* (2013.01); *G06T 2219/2016* (2013.01); *G06T 2219/2021* (2013.01)

(56) References Cited

U.S. PATENT DOCUMENTS

2007/0080960 A1* 4/2007 Dayanand ............... G06T 19/00
 345/419
2008/0036773 A1* 2/2008 Bae ........................ G06T 11/203
 345/442
2012/0162258 A1* 6/2012 Kim ........................ G06F 1/1626
 345/633

OTHER PUBLICATIONS

Igarashi, T., et al., "A suggestive interface for 3D drawing," ACM SIGGRAPH 2007 (Aug. 2007), pp. 1-9, XP058244687, ACM Press, New York, US.

* cited by examiner

METHOD FOR DEFINING DRAWING PLANES FOR THE DESIGN OF A 3D OBJECT

RELATED APPLICATION(S)

This application claims priority under 35 U.S.C. § 119 or 365 to Europe, Application No. 17306969.1, filed Dec. 28, 2017. The entire teachings of the above application(s) are incorporated herein by reference.

FIELD OF INVENTION

The invention relates to the field of computers programs and systems, and more specifically to the field of computer-implemented methods for designing and drawing a three-dimensional (3D) modeled object in a 3D scene.

The present invention belongs to the field of the design of 3D objects (sketching, modeling, review, CAD . . . ). In particular, the present invention belongs to the sketching field, in which a software product such as Natural Sketch, provided by Dassault Systèmes, can be used. With some strokes (using for example a tablet and a stylus, or a mouse) the user/designer gets the full 3D curves of his sketch. Then he can easily modify these curves until reaching the concept he imagined. Thus, the user does not need to wait for the step of 3D modeling to have a 3D rendering of his drawing.

BACKGROUND

One of the functions of a product such as Natural Sketch is to allow the user to draw 3D models. To do such a thing, the user has different possibilities. For example, in the scene, there can be a surface (a car, a sphere . . . ) on which the user will draw. As the surface is in three dimensions, the curves on the surface will be 3D curves. But when the user has no surface on which he can rely on, i.e. when he wants to create a 3D model from scratch, he needs to proceed otherwise.

In that case, the user switches from a drawing command button to a plane selection command button, and vice versa, until all the planes are defined. Starting from scratch, he first needs to define on which plane he is going to draw. For that, the user can start to draw on a default plane (e.g. the xz plane). If the user wants to start to draw on a plane which is different from the default plane, he can also press the plane selection command button. A plane manipulator (square-shaped in Natural Sketch) enables the user to choose and move (translation, rotation . . . ) the plane on which he wants to start to draw. When the pointing element (a cursor) is moved close to one of the edges of the plane manipulator, the edge is highlighted. The drawing plane can then be rotated around an axis which passes through the center of the plane manipulator, and which is parallel to the highlighted edge. With a left press of the mouse on the plane manipulator, the user can change the drawing plane, according to the angle which is selected during the moving of the mouse. He can also change the origin of the drawing plane. For that, the user moves the pointing element on a central square of the plane manipulator which is located inside the square-shaped plane manipulator. A visual feedback, such as a highlighting of the central square, occurs, when the pointing element is moved in the central square. Then, the user can translate the origin of the drawing plane along the normal of the plane of the central square, while pressing the left button of the mouse. After that, the user can press (e.g. with the left-button of the mouse or with a stylus/finger) the drawing command button, and sketches (e.g. with the left-button of the mouse or with a stylus/finger) at least one first stroke in the drawing plane as defined above. Then, if the user wants to change the drawing plane, he has to press again the plane selection command button so as to use the plane manipulator. Throughout the drawing process, the user can navigate in the three-dimensional scene in order to change the viewpoint, by using, for example, a combination of moving the mouse while pressing the middle button of the mouse.

This way to proceed during a creation phase is quite cumbersome. Indeed, with the use of the plane manipulator, a lot of mouse displacements are needed to change the planes to be defined: first, to launch the plane selection command (which is generally outside the scene), and then to put the plane in the desired orientation and position with the plane manipulator. This way to proceed is also time consuming and not intuitive, since the user knows what he wants to do, he has some inspiration but he keeps going back and forth in the plane selection command to define the plane he needs. Another drawback of the existing solution is the lack of simplicity: to get a plane with the desired orientation and position, the user has to combine rotations (for example, rotation around one of the four edges of the plane) and different translations (for example, translation along the normal of the plane).

SUMMARY

A goal of the invention is then to provide an intuitive method for defining planes in a 3D scene, and drawing a 3D object on the defined planes, without requiring the execution of a specific command, and which lowers also the distance traveled by the mouse during the drawing process.

It is proposed, according to one aspect of the invention, a computer-implemented method for drawing a 3D object, said 3D object being rendered in a 3D scene on a computer screen through a virtual camera, the method comprising the steps of:
  sketching at least one first stroke in a first plane rendered in a first viewing frustum corresponding to a first pose of the virtual camera, said first plane being orthogonal to a second and a third plane;
  in response to a command of a user switching from the first pose to a second pose of the virtual camera, switching from the first viewing frustum to a second viewing frustum corresponding to the second pose of the virtual camera, said second viewing frustum being bounded by a near plane on the side of the virtual camera;
  selecting, as current drawing plane, a plane among the first, the second and the third plane, whose normal is the closest to the normal of the near plane;
  sketching at least one second stroke in the current drawing plane.

According to particular embodiments of the invention:
  The method may comprise the computing of the absolute value of the scalar product of the normal of the near plane and the normal of each of the first, second and third planes.
  The current drawing plane being orthogonal to the first plane, the method may comprise a step of determining the extremity of the last sketched first stroke in the first plane which is closest to the near plane, the current drawing plane passing through said extremity, said extremity being defined as the origin of the current drawing plane.
  The method may comprise a step of setting an origin through which the current drawing plane passes, in response to an activation input designating a 3D point of one of the strokes of the 3D scene.

The activation input may comprise the pressing and holding of an activation button while moving a pointing element in the 3D scene along one of the sketched strokes until the release of said activation button, thereby setting the origin of the current drawing plane on the designated 3D point.

The activation button may be a keyboard button.

The method may comprise the step of providing a visual feedback of the current drawing plane.

The visual feedback may be a highlighting of the strokes of the current drawing plane.

The method may comprise an initial step of defining as first plane a plane which is the closest from the near plane.

The method may comprise an initial step of defining as first plane a previously defined plane.

It is also proposed a computer program product, stored on a non-transitory computer-readable data-storage medium, comprising computer-executable instructions to cause a computer system to carry out the predefined method.

It is also proposed a non-transitory computer-readable data-storage medium containing computer-executable instructions to cause a computer system to carry out the predefined method.

It is also proposed a computer system comprising a processor coupled to a memory and a graphical user interface, the memory storing computer-executable instructions to cause the computer system to carry out the predefined method.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

The invention will be better understood with the study of some embodiments described by way of non-limiting examples and illustrated by the accompanying drawings wherein.

DETAILED DESCRIPTION

A description of example embodiments follows.

Figure 1:
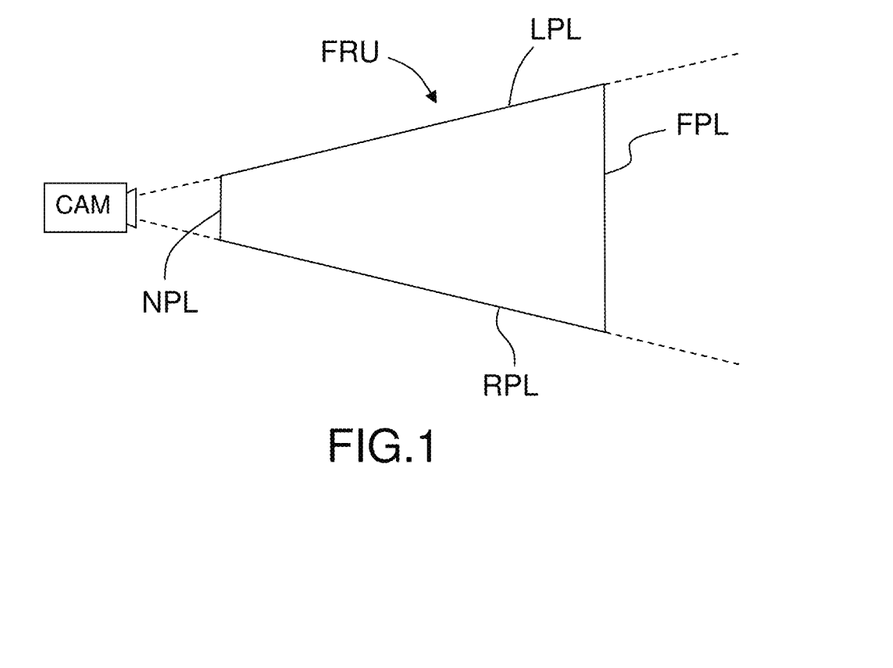
FIG. 1 illustrates an example of a viewing frustum.

Hereafter, the "viewing frustum" FRU refers to the region of space which may be rendered on the screen for the user; it is the field of view of a virtual camera CAM. FIG. 1 is a top view of a viewing frustum FRU. The viewing frustum FRU is a truncated pyramid. The planes which cut the viewing frustum perpendicular to the viewing direction of the virtual camera are called the "near plane" NPL and the "far plane" FPL. The viewing frustum is bounded by the near plane NPL on the side of the virtual camera CAM and by the far plane FPL on the opposite side. The viewing frustum is also bounded by a left plane LPL, a right plane RPL, a top plane (not represented) and a bottom plane (not represented).

Hereafter, the "pose" (also referred as the viewpoint) of the virtual camera refers to its position and its orientation in relation to a fixed reference frame on the scene.

Hereafter, a plane is defined by two main non collinear vectors ($\vec{u}$, $\vec{v}$) and one origin (O). A plane is the set of points M of the 3D space which are defined by the relation: $\vec{OM}=x.\vec{u}+y.\vec{v}$ (x and y are real numbers). Thus, the origin of a plane is a 3D point, through which the plane passes. The normal n of the plane is easily got back by doing a vector product of $\vec{u}$ and $\vec{v}$. Therefore, two parallel and disjoint planes (P1, P2) are characterized by the same main non collinear vectors ($\vec{u}$, $\vec{y}$), with different origins. The origin of the plane P2 results from the projection of the origin of the plane P1 on the plane P2. In the present application, the origin of a plane refers to its "depth" in the 3D scene.

Figure 2:
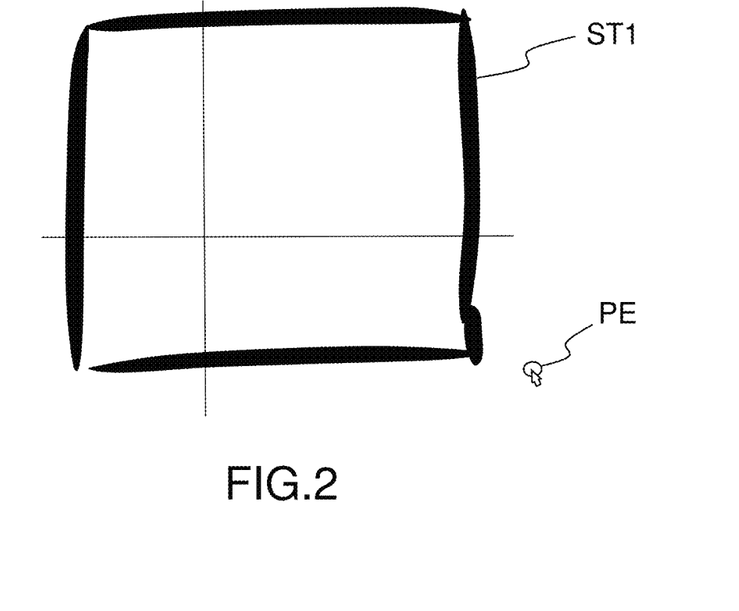
FIGS. 2 to 7 illustrates an example of a method for drawing a 3D object in a 3D scene according to the invention.

FIG. 2 illustrates a first step of the invention. The user starts to draw a first stroke ST1 in an initial plane. The initial plane is orthogonal to a second plane (PL2) and to a third plane (PL3). The initial plane is a default plane, or a previously defined plane. To draw a first stroke ST1 in the initial plane, the user employs a sketching input. For example, the sketching input can be the left button of the mouse, a stylus or a finger in touch mode. As long as the user maintains the sketching input (for example pressing and holding the left button of the mouse, or keeping contact of the stylus or the finger on the touch sensitive surface), the first stroke ST1 is sketched. The user can draw several first strokes ST1 in the same initial plane, if he releases the sketching input between two first strokes ST1. For the sake of readability of the figures, all the strokes which are sketched on a same plane have the same reference. On the present example, the first strokes ST1 represent nearly a square. The first strokes ST1 are rendered in a first viewing frustum corresponding to a first pose of the virtual camera. The user can interact with a pointing element PE, so as to switch from the first pose to a second pose of the virtual camera. The interaction with the pointing element PE can be made through a dragging operation. This operation can be made for example with a combination of moving the mouse while pressing and holding the middle button of the mouse, or while pressing and holding the middle button of the mouse and the left button of the mouse, or while pressing and holding a keyboard button.

As long as the user drags (moves the mouse while pressing and holding the middle button of the mouse, or a combination of the middle button of the mouse with the left or right button of the mouse) the pointing element PE in the 3D scene, the pose of the virtual camera is switched. On FIG. 3, the first strokes ST1 are rendered according to a second viewing frustum, which corresponds to a second pose of the virtual camera.

The inventors have found that the planes which are chosen to design and draw a 3D model are often orthogonal. They have also found that, most of the times, the user's strokes are performed in planes which are close to the near plane. Indeed, drawing on a plane which is far from the near plane would substantially distort the proportions of the drawing. For example, trying to draw a circle in a plane which is almost orthogonal to the near plane is very difficult, (it results generally in an ellipse), whereas the operation is easier in a plane which is almost parallel to the near plane. Consequently, the selection of the drawing planes relies on these two postulates.

Figure 3:
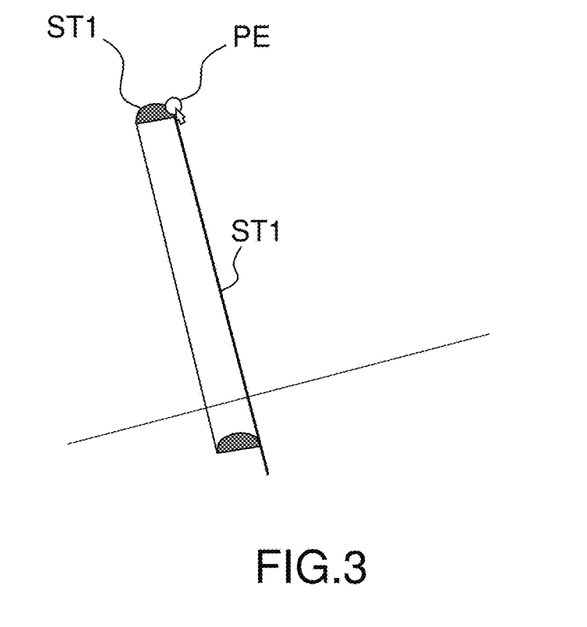

According to a first embodiment, the normal of the near plane of the second viewing frustum is computed as soon as the user releases the middle button of the mouse. Next, the normal of the near plane is compared with the normal of the first (PL1), second (PL2) and third planes (PL3). The comparison can be made by computing the scalar product of the normal of the near plane and the normal of each of the first (PL1), second (PL2) and third planes (PL3). For each of the first (PL1), second (PL2) and third planes, the scalar product of the plane and the normal of the screen plane is computed. The one which has a maximum scalar product absolute value is considered as the closest to the near plane. The closest plane is then considered as the current drawing plane. According to a second embodiment, whenever the user interacts with the pointing element through dragging it, the normal of the screen plane of the second viewing frustum is compared to the normal of the first (PL1), second (PL2) and third planes. Then, the closeness of the first (PL1), second (PL2) and third planes with the screen plane is computed on the fly.

Figure 4:
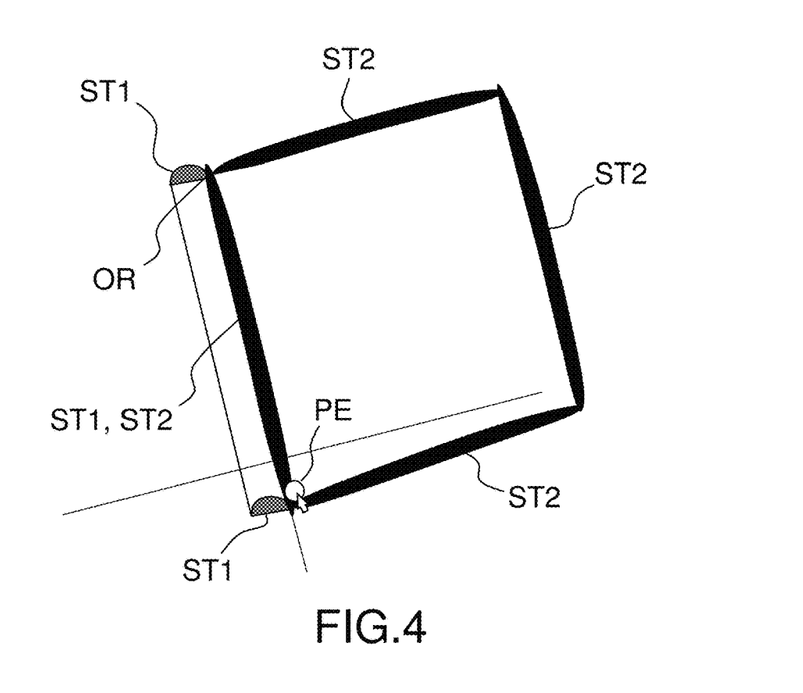

On FIG. 4, the user sketches second strokes ST2 in the current drawing plane, as rendered in the second viewing frustum. It is understood that the plane of the first strokes ST1 and the plane of the second strokes ST2 are orthogonal, even though the near plane of the first viewing frustum and the plane of the second viewing frustum are not necessarily orthogonal. It is proposed, according to the invention, to compute automatically, in a default mode, an origin of the current drawing plane. In a preferred embodiment, the origin OR of the current drawing plane is computed based on the last sketched first stroke ST1 in the first plane. More precisely, the extremity of the last sketched first stroke ST1 in the first plane which is closest to the near plane of the second viewing frustum defines the origin OR of the current drawing plane. Therefore, the user moves the pointing element PE close to the strokes ST1 he has already made in the first plane in order to start the next one in the current drawing plane. The user also moves the pointing element PE close to where the first plane and the current drawing plane are intersecting. Indeed, once the user has completed a series of strokes (first strokes ST1) in a first plane, he may change the pose of the virtual camera, in order to continue, with nearly no interruption, in the current drawing plane, the design of the 3D object (with second strokes ST2). He may continue the design of the 3D object in the current drawing plane, starting from the closest extremity of the last strokes of the preceding plane. For that, the distance between the virtual camera and a first extremity of the last sketched first stroke ST1 is compared to the distance between the virtual camera and a second extremity of the last sketched first stroke ST1. The computing of the distance between the virtual camera and a point in the 3D scene is known for the skilled person. The extremity corresponding to the closest distance is defined as the origin of the current drawing plane.

Figure 5:
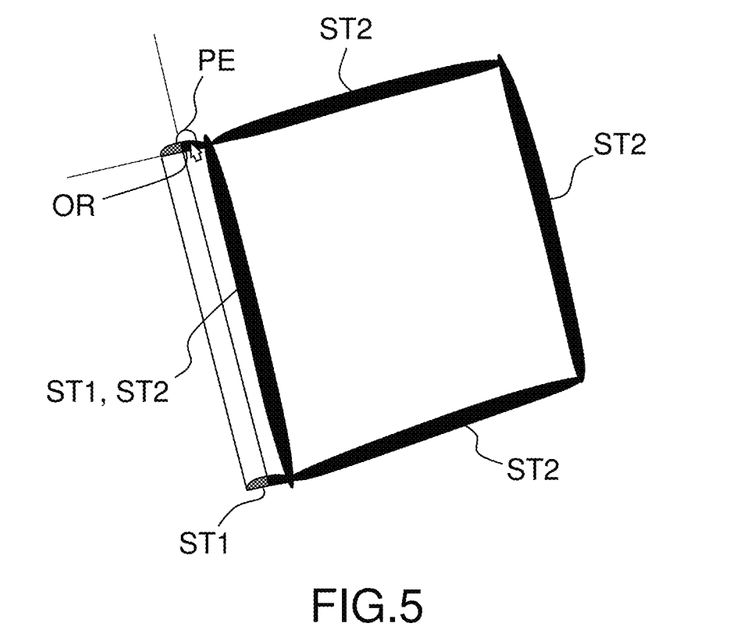

In a second embodiment, illustrated by FIG. 5, the user can modify the origin OR of the current drawing plane, so as to select the "depth" of the drawing plane. Consequently, the user can design the 3D object on parallel planes in an almost uninterrupted design process. For that, he uses an activation input designating a 3D point of one of the strokes (ST1, ST2) of the 3D scene. To do so, the user presses and holds an activation button, while moving the pointing element PE with the mouse (without pressing a mouse button) in the 3D scene along one of the sketched strokes (ST1, ST2). The activation button can be for example a keyboard button, more precisely the "CTRL" button of the keyboard. The setting of the origin OR is performed as long as the user presses and holds the activation button. The origin of the current drawing plane is finally determined when the user releases the activation button. In the example which is illustrated by FIG. 5, the user can designate a first stroke ST1 which is sketched only in the first plane. A visual feedback can be progressively generated on all the first strokes ST1 of the first plane PL1, according to the displacement of the pointing element PE along the first stroke ST1. Therefore, in order to sketch the next stroke in a parallel plane, the user naturally moves the pointing element PE near the strokes he has already sketched, which avoids useless mouse movements. He also intuitively moves the pointing element PE close to the intersection of the drawing planes which have already been defined, thereby also saving mouse movements.

Figure 6:
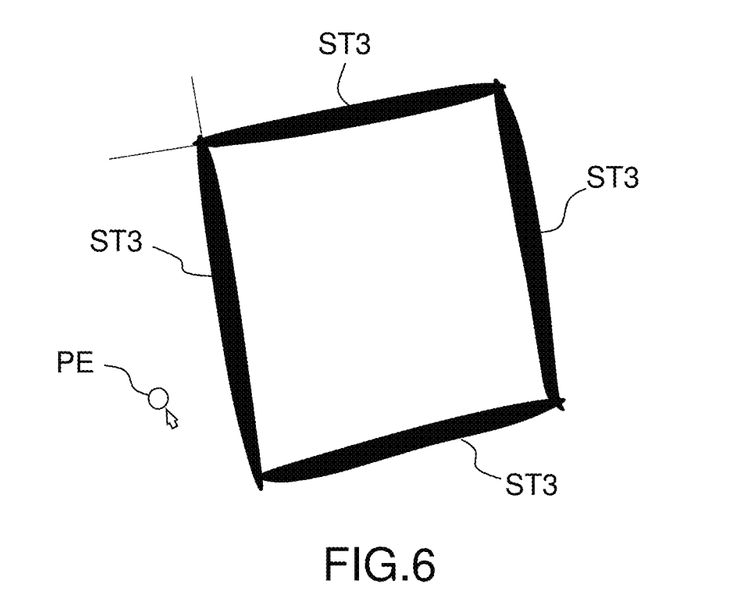
Figure 7:
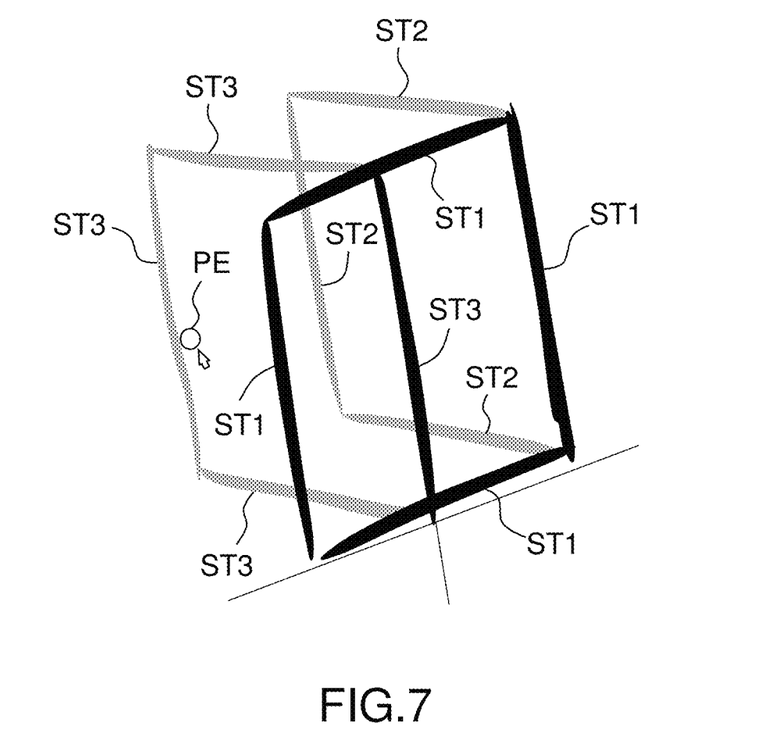

Once the user has set an origin OR, he can switch to another pose of the virtual camera, thereby switching the viewing frustum. In the illustrated example, the near plane of the viewing frustum of FIG. 6 is changed, but only the origin of the plane is different from FIG. 5. Indeed, the plane whose normal is closest to the normal of the screen plane is the same in both figures. Therefore, the user can sketch third strokes ST3 in a plane which is parallel to the plane of the second strokes ST2. FIG. 7 illustrates, with another pose of the virtual camera, the 3D object which has been drawn.

In a preferred embodiment, a visual feedback of the current drawing plane, i.e. whose normal is the closest to the normal of the near plane, can be provided. For example, a highlighting of the strokes of the current drawing plane can be performed, so that the user instantly sees on which planes he is going to draw.

Figure 8:
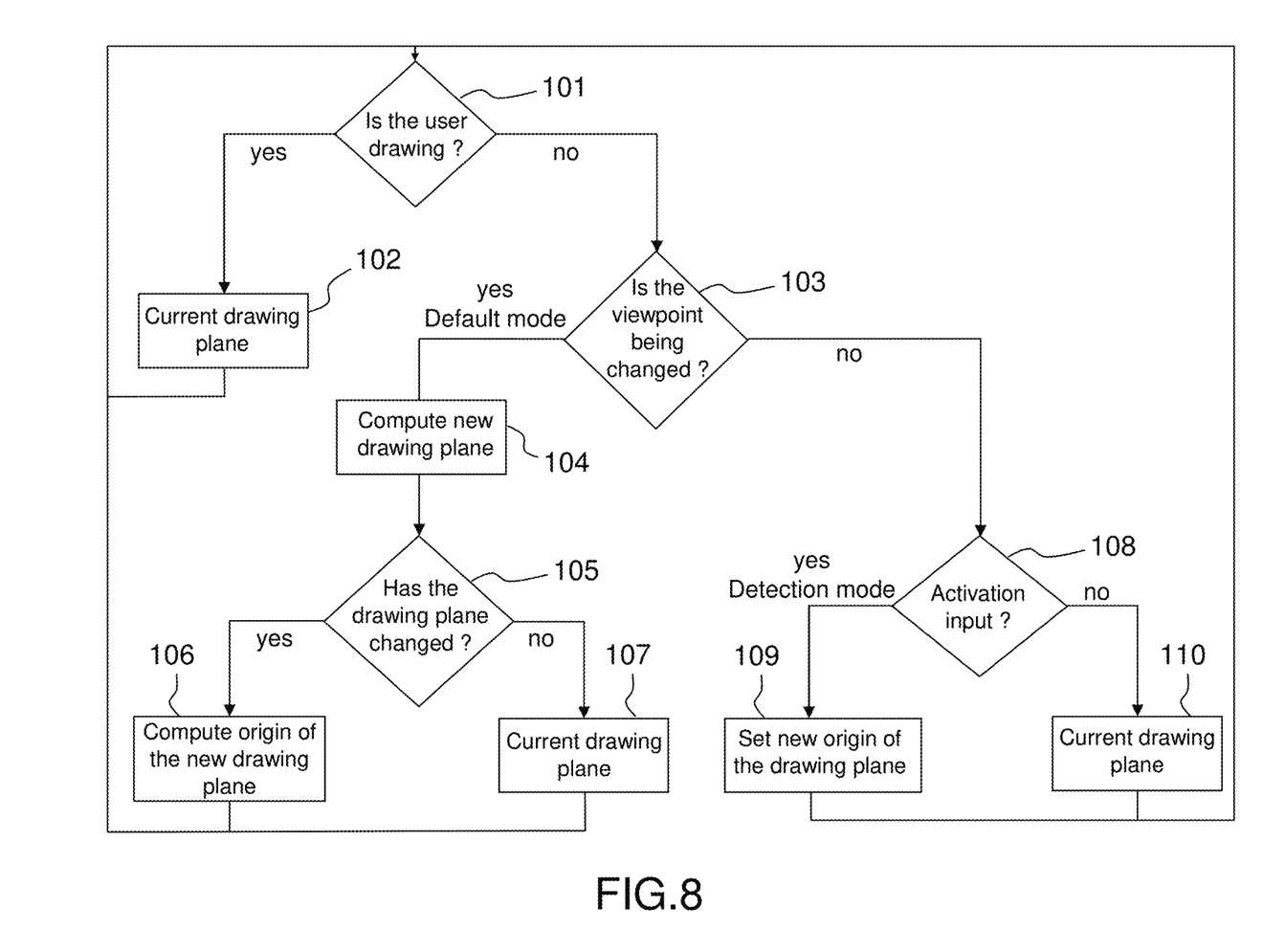
FIG. 8 illustrates a flowchart of the different steps of a method according to the invention.

On FIG. 8 is represented a flow-chart of a method according to the invention. A test 101 is made to check if the user is drawing. If the user is drawing, i.e. as long as a sketching input is detected, the drawing plane remains unchanged (step 102). If he is not drawing, a test 103 is made to check if the pose of the virtual camera is being changed. Thus, a test of detection of the pressing of the middle button (optionally with left button) of the mouse is being made. A new drawing plane is then computed at step 104. Then, a test 105 is made to check if the drawing plane has changed. If the test is affirmative, the origin of the drawing plane is computed, based on the distance of each of the extremities to the virtual camera (step 106). If the test is negative, the user continues to draw in the same plane (step 107). If the test 103 is negative, a test 108 is made to detect an activation input of the setting of the origin (for example if the pressing of a keyboard button, especially the CTRL button, is detected). If the test is affirmative, a new origin is set (step 109). If the test is negative, the user continues to draw in the same plane as initially (step 110).

Thanks to the invention, the user does not need to break his creation process to translate or rotate a plane until he reaches a precise location.

The inventive method can be performed by a suitably-programmed general-purpose computer or computer system, possibly including a computer network, storing a suitable program in non-volatile form on a computer-readable medium such as a hard disk, a solid state disk or a CD-ROM and executing said program using its microprocessor(s) and memory.

Figure 9:
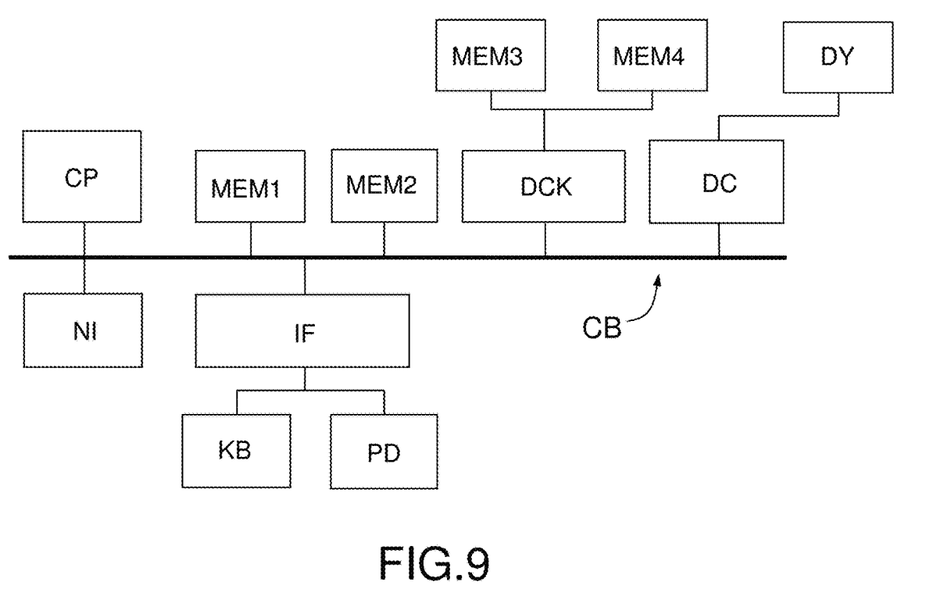
FIGS. 9 and 10 illustrate block diagrams of respective computer systems suitable for carrying out a method according to different embodiments of the invention.

A computer suitable for carrying out a method according to an exemplary embodiment of the present invention is described with reference to FIG. 9. In FIG. 9, the computer includes a Central Processing Unit (CPU) CP which performs the method step described above while running an executable program, i.e. a set of computer-readable instructions, stored in a memory device such as RAM MEM1 or ROM MEM2 or hard disk drive (HDD) MEM3, DVD/CD drive MEM4, or stored remotely. Moreover, one or more computer files defining the three-dimensional object may also be stored on one or more of memory devices MEM1 to MEM4, or remotely.

The claimed invention is not limited by the form of the computer-readable media on which the computer-readable instructions of the inventive process are stored. For example, the instructions and files can be stored on CDs, DVDs, in FLASH memory, RAM, ROM, PROM, EPROM, EEPROM, hard disk or any other information processing device with which the computer communicates, such as a server or computer. The program can be stored on a same memory device or on different memory devices.

Further, a computer program suitable for carrying out the inventive method can be provided as a utility application, background daemon, or component of an operating system, or combination thereof, executing in conjunction with CPU P and an operating system such as Microsoft VISTA, Microsoft Windows 8, UNIX, Solaris, LINUX, Apple MAC-OS and other systems known to those skilled in the art.

CPU CP can be a Xeon™ processor from Intel of America or an Opteron™ processor from AMD of America, or can be other processor types, such as a Freescale ColdFire™, IMX™, or$^{jJ™}$ processor from Freescale Corporation of America. Alternatively, the CPU can be a processor such as a Core2 Duo from Intel Corporation of America, or can be implemented on an FPGA, ASIC, PLD or using discrete logic circuits, as one of ordinary skill in the art would recognize. Further, the CPU can be implemented as multiple processors cooperatively working to perform the computer-readable instructions of the inventive processes described above.

The computer in FIG. 9 also includes a network interface NI, such as an Intel Ethernet PRO network interface card from Intel Corporation of America, for interfacing with a network, such as a local area network (LAN), wide area network (WAN), the Internet and the like. The computer further includes a display controller DC, such as a NVIDIA GeForce™ GTX graphics adaptor from NVIDIA Corporation of America for interfacing with display DY, such as a Hewlett Packard HPL2445w LCD monitor. A general purpose I/O interface IF interfaces with a keyboard KB and pointing device PD, such as a roller ball, mouse, touchpad and the like. The display, the keyboard, the sensitive surface for the touch mode and the pointing device, together with the display controller and the I/O interfaces, form a graphical user interface, used by the user to provide input commands—e.g. to move the pointer—and by the computer for displaying the three-dimensional scene and the graphical tool.

Disk controller DKC connects HDD MEM3 and DVD/CD MEM4 with communication bus CBS, which can be an ISA, EISA, VESA, PCI, or similar, for interconnecting all of the components of the computer.

A description of the general features and functionality of the display, keyboard, pointing device, as well as the display controller, disk controller, network interface and I/O interface is omitted herein for brevity as these features are known.

Figure 10:
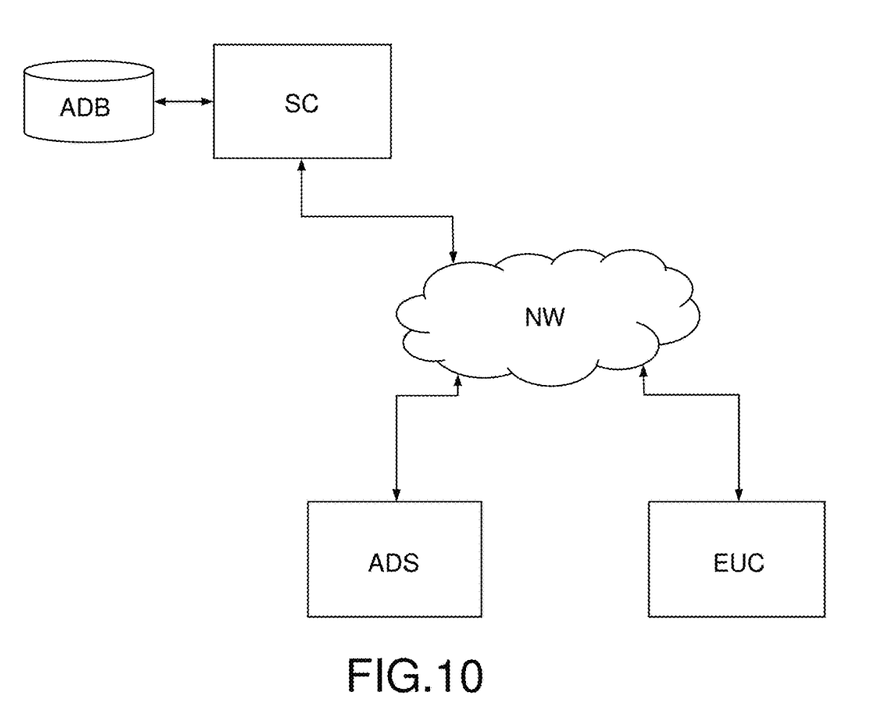

FIG. 10 is a block diagram of a computer system suitable for carrying out a method according to a different exemplary embodiment of the present invention.

In FIG. 10, the executable program EXP and the computer files defining the three-dimensional object are stored on memory devices connected to a server SC. The memory devices and the overall architecture of the server may be the same as discussed above with reference to FIG. 9, except that display controller, sensitive surface, display, keyboard and/or pointing device may be missing in the server.

The server SC is then connected to an administrator system ADS and end user computer EUC via a network NW.

The overall architectures of the administrator system and of the end user computer may be the same as discussed above with reference to FIG. 9, except that the memory devices of the administrator system and the end user computer do not store the executable program EXP and/or the computer files defining the three-dimensional object. However, the end user computer does store a client program designed for cooperating with the executable program of the server, as it will be discussed below.

As can be appreciated, the network NW can be a public network, such as the Internet, or a private network such as an LAN or WAN network, or any combination thereof and can also include PSTN or ISDN sub-networks. The network NW can also be wired, such as an Ethernet network, or can be wireless such as a cellular network including EDGE, 3G and 4G wireless cellular systems. The wireless network can also be Wi-Fi, Bluetooth, or any other wireless form of communication that is known. Thus, the network NW is merely exemplary and in no way limits the scope of the present advancements.

The client program stored in a memory device of the end user computer and executed by a CPU of the latter accesses, via the network NW, a database DB stored by the server SC and containing files defining three-dimensional object. The server performs the processing as described above, and transmits to the end user computer an image file corresponding to the desired representation of the scene including the 3D object, again using the network NW.

Although only one administrator system ADS and one end user system EUX are shown, the system can support any number of administrator systems and/or end user systems without limitation. Similarly, multiple servers can also be implemented in the system without departing from the scope of the present invention Any method steps described herein should be understood as representing modules, segments, or portions of code which include one or more executable instructions for implementing specific logical functions or steps in the process, and alternate implementations are included within the scope of the exemplary embodiment of the present invention.

The teachings of all patents, published applications and references cited herein are incorporated by reference in their entirety.

While example embodiments have been particularly shown and described, it will be understood by those skilled in the art that various changes in form and details may be made therein without departing from the scope of the embodiments encompassed by the appended claims.

What is claimed is:

1. A computer-implemented method for drawing a 3D object, said 3D object being rendered in a 3D scene on a computer screen through a virtual camera, the method comprising the steps of:

sketching at least one first stroke (ST1) in a first plane (PL1) rendered in a first viewing frustum corresponding to a first pose of the virtual camera, said first plane (PL1) being orthogonal to a second (PL2) and a third plane (PL3);

in response to a command of a user switching from the first pose to a second pose of the virtual camera, switching from the first viewing frustum to a second viewing frustum corresponding to the second pose of the virtual camera, said second viewing frustum being bounded by a near plane on the side of the virtual camera;

selecting, as current drawing plane, a plane among the first (PL1), the second (PL2) and the third plane (PL3), whose normal has a maximum scalar product absolute value with the normal of the near plane;

determining the extremity of a last sketched first stroke (ST1) in the first plane (PL1) which is closest to the near plane, the current drawing plane passing through said extremity, said extremity being defined as the origin (OR) of the current drawing plane; and sketching at least one second stroke (ST2) in the current drawing plane.

2. The method according to claim 1, further comprising a step of computing an absolute value of a scalar product of the normal of the near plane and the normal of each of the first (PL1), second (PL2) and third planes (PL3).

3. The method according to claim 1, comprising a step of modifying the origin (OR) through which the current drawing plane passes, in response to an activation input designating a 3D point of one of the strokes (ST1, ST2) of the 3D scene.

4. The method according to claim 3, wherein the activation input comprises the pressing and holding of an activation button while moving a pointing element (PE) in the 3D scene along one of the sketched strokes (ST1, ST2) until the release of said activation button, thereby setting the origin (OR) of the current drawing plane on the designated 3D point.

5. The method according to claim 4, wherein the activation button is a keyboard button.

6. The method according to claim 1, comprising the step of providing a visual feedback of the current drawing plane.

7. The method according to claim 6, wherein the visual feedback is a highlighting of the strokes of the current drawing plane.

8. The method according to claim 1, comprising an initial step of defining as first plane a plane which is the closest from the near plane.

9. The method according to claim 1, comprising an initial step of defining as first plane a previously defined plane.

10. A computer program product, comprising:
a non-transitory computer-readable data-storage medium (MEM1-MEM4), storing computer-executable instructions to cause a computer system to draw a 3D object rendered in a 3D scene on a computer screen through a virtual camera; and
the computer-executable instructions including instructions that configure the computer system to:
sketch at least one first stroke (ST1) in a first plane (PL1) rendered in a first viewing frustum corresponding to a first pose of the virtual camera, said first plane (PL1) being orthogonal to a second (PL2) and a third plane (PL3);
in response to a command of a user switching from the first pose to a second pose of the virtual camera, switch from the first viewing frustum to a second viewing frustum corresponding to the second pose of the virtual camera, said second viewing frustum being bounded by a near plane on the side of the virtual camera;
select, as current drawing plane, a plane among the first (PL1), the second (PL2) and the third plane (PL3), whose normal has a maximum scalar product absolute value with the normal of the near plane;
determine the extremity of a last sketched first stroke (ST1) in the first plane (PL1) which is closest to the near plane, the current drawing plane passing through said extremity, said extremity being defined as the origin (OR) of the current drawing plane; and
sketch at least one second stroke (ST2) in the current drawing plane.

11. A non-transitory computer-readable data-storage medium (MEM1-MEM4) comprising:
a memory area containing computer-executable instructions (EXP) to cause a computer system to draw a 3D object rendered in a 3D scene on a computer screen through a virtual camera; and
the computer-executable instructions including instructions to draw the 3D object by:
sketching at least one first stroke (ST1) in a first plane (PL1) rendered in a first viewing frustum corresponding to a first pose of the virtual camera, said first plane (PL1) being orthogonal to a second (PL2) and a third plane (PL3);
in response to a command of a user switching from the first pose to a second pose of the virtual camera, switching from the first viewing frustum to a second viewing frustum corresponding to the second pose of the virtual camera, said second viewing frustum being bounded by a near plane on the side of the virtual camera;
selecting, as current drawing plane, a plane among the first (PL1), the second (PL2) and the third plane (PL3), whose normal has a maximum scalar product absolute value with the normal of the near plane;
determining the extremity of a last sketched first stroke (ST1) in the first plane (PL1) which is closest to the near plane, the current drawing plane passing through said extremity, said extremity being defined as the origin (OR) of the current drawing plane; and
sketching at least one second stroke (ST2) in the current drawing plane.

12. A computer system comprising:
a processor (CP) coupled to a memory (MEM1-MEM4) and a graphical user interface (KB, PD, DC, DY),
the memory storing computer-executable instructions (EXP) to cause the computer system to draw a 3D object rendered in a 3D scene on a computer screen through a virtual camera, said drawing the 3D object being by:
sketching at least one first stroke (ST1) in a first plane (PL1) rendered in a first viewing frustum corresponding to a first pose of the virtual camera, said first plane (PL1) being orthogonal to a second (PL2) and a third plane (PL3);
in response to a command of a user switching from the first pose to a second pose of the virtual camera, switching from the first viewing frustum to a second viewing frustum corresponding to the second pose of the virtual camera, said second viewing frustum being bounded by a near plane on the side of the virtual camera;
selecting, as current drawing plane, a plane among the first (PL1), the second (PL2) and the third plane (PL3), whose normal has a maximum scalar product absolute value with the normal of the near plane;

determining the extremity of a last sketched first stroke (ST1) in the first plane (PL1) which is closest to the near plane, the current drawing plane passing through said extremity, said extremity being defined as the origin (OR) of the current drawing plane; and sketching at least one second stroke (ST2) in the current drawing plane.

\* \* \* \* \*